United States Patent [19]
Mehrotra et al.

[11] Patent Number: 6,086,238
[45] Date of Patent: Jul. 11, 2000

[54] METHOD AND SYSTEM FOR SHAPE PROCESSING WITHIN AN INTEGRATED CIRCUIT LAYOUT FOR PARASITIC CAPACITANCE ESTIMATION

[75] Inventors: Sharad Mehrotra, Austin; Paul Gerard Villarrubia, Round Rock; David James Widiger, Pflugerville, all of Tex.

[73] Assignee: International Business Machines Corporation, Armonk, N.Y.

[21] Appl. No.: 08/726,721

[22] Filed: Oct. 7, 1996

[51] Int. Cl.$^7$ .................................................. G06F 17/50
[52] U.S. Cl. .................................................. 364/490
[58] Field of Search .................................. 364/488, 489, 364/490, 491, 578

[56] References Cited

U.S. PATENT DOCUMENTS

| | | | |
|---|---|---|---|
| 4,893,170 | 1/1990 | Tokuda et al. | 357/71 |
| 5,367,469 | 11/1994 | Hatoog | 364/491 |
| 5,452,224 | 9/1995 | Smith, Jr. et al. | 364/488 |
| 5,502,644 | 3/1996 | Hamilton et al. | 364/488 |
| 5,610,833 | 3/1997 | Chang et al. | 364/491 |
| 5,706,206 | 1/1998 | Hammer et al. | 364/489 |

OTHER PUBLICATIONS

Belkhale et al., "Parallel Algorithms for Vlsi Circuit Extraction", IEEE Transactions on Computer Aided Design, Col. 10, No. 5, May 1991, pp. 604–618.

Chiang, "Resistance Extraction and Resistance Calculation in Goalie2", 26th ACM/IEEE Design Automation Conference, AT&T Bell Laboratories, Paper 40.3, pp. 682–685.

Chiang et al., "Time Efficient VLSI Artwork Analysis Algorithms in Goalie2", 25th ACM/IEEE Design Automation Conference, AT&T Bell Laboratories, Paper 30.3, pp. 471–475.

*Primary Examiner*—Emanuel Todd Voeltz
*Assistant Examiner*—Leigh Marie Garbowski
*Attorney, Agent, or Firm*—Anthony V.S. England; Antony P. Ng; Andrew J. Dillon

[57] ABSTRACT

A method and system for shape processing within an integrated circuit layout for parasitic capacitance estimation is disclosed. In accordance with the method and system of the present invention, a set of coordinates of an overlapping region formed by at least one interconnect is first identified. Subsequently, each metal layer present within the overlapping region is classified. Each interconnect edge present on each side of the overlapping region is then determined. Finally, a neighbor in a direction perpendicular to each side of the overlapping region is determined. By so doing, the parasitic capacitance between the overlapping region and its determined neighbors can be evaluated.

9 Claims, 5 Drawing Sheets

METHOD AND SYSTEM FOR SHAPE PROCESSING WITHIN AN INTEGRATED CIRCUIT LAYOUT FOR PARASITIC CAPACITANCE ESTIMATION

CROSS-REFERENCE TO A RELATED APPLICATION

The present invention is related to the subject matter of a co-pending United States patent application entitled "Method and System for Characterizing Interconnect Data Within an Integrated Circuit for Facilitating Capacitance Estimation," Ser. No. 08/726,722 (IBM Docket No. AT9-96-124) filed Oct. 07, 1996, and assigned to the assignee herein named. The content of the above-mentioned co-pending United States patent application is incorporated by reference herein.

BACKGROUND OF THE INVENTION

1. Technical Field

The present invention relates to a method and system for data processing in general and, in particular, to a method and system for extracting data for capacitance estimation. Still more particularly, the present invention relates to a method and system for shape processing within an integrated circuit layout for parasitic capacitance estimation.

2. Description of the Prior Art

During the course of designing a very large-scale integrated (VLSI) circuit, it is desirable to render some form of circuit characterization in order to determine the performance of the circuit. The characteristic of a VLSI circuit is generally dependent upon two major factors, namely, parasitic capacitance and parasitic resistance. Needless to say, parasitic capacitances associated with interconnect materials within a VLSI circuit can result in unacceptable circuit performances. Hence, it is very important to calculate all the parasitic capacitances within a VLSI circuit in order to determine whether or not they exceed certain design criteria before actual fabrication of the circuit.

Circuit characterization generally begins with circuit extraction. A circuit extraction software, such as a netlist extractor, is typically utilized to extract various circuits that are required to be simulated, from a VLSI circuit layout. The result of such circuit extraction includes not only the circuitry itself, but also includes the parasitic capacitance and parasitic resistance that are inherent within the interconnect materials. Within a circuit extraction software, there are shape-processing algorithms for detecting and reporting each capacitance event in the VLSI circuit layout. Because the amount of data within a VLSI circuit layout is very large, it is desirable for the data to be externalized, i.e., all the shapes in the VLSI circuit layout should not be loaded in the memory of a data processing system. A shape-processing algorithm known as "scanline" algorithm has this characteristic. Scanline algorithms have been utilized extensively in shape processing for design rule checking and parasitic capacitance (and resistance) extraction. In addition, several enhancements have been added to these scanline algorithms to achieve optimal run-times. Also, scanline algorithms only require an average of $N^{1/2}$ shapes in the memory of the data processing system, where N is the total number of shapes in the layout. This invention is to provide further enhancements to these shape-processing algorithms for extracting interconnect information from a VLSI circuit layout according to a preferred data structure such that parasitic capacitance estimation can be performed in a more efficient manner.

SUMMARY OF THE INVENTION

In view of the foregoing, it is therefore an object of the present invention to provide an improved method and system for data processing.

It is another object of the present invention to provide an improved method and system for extracting data for capacitance estimation.

It is yet another object of the present invention to provide an improved method and system for shape processing within an integrated circuit for parasitic capacitance estimation.

In accordance with the method and system of the present invention, a set of coordinates of an overlapping region formed by at least one interconnect is first identified. Subsequently, each metal layer present within the overlapping region is classified. Each interconnect edge present on each side of the overlapping region is then determined. Finally, a neighbor in a direction perpendicular to each side of the overlapping region is determined. By so doing, the parasitic capacitance between the overlapping region and its determined neighbors can be evaluated.

All objects, features, and advantages of the present invention will become apparent in the following detailed written description.

BRIEF DESCRIPTION OF THE DRAWING

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be executed in a variety of computers under a number of different operating systems. The computer may be, for example, a workstation, a minicomputer, or a mainframe computer. In addition, the computer may be a stand-alone system or part of a network such as a local-area network (LAN) or a wide-area network (WAN).

Figure 1:
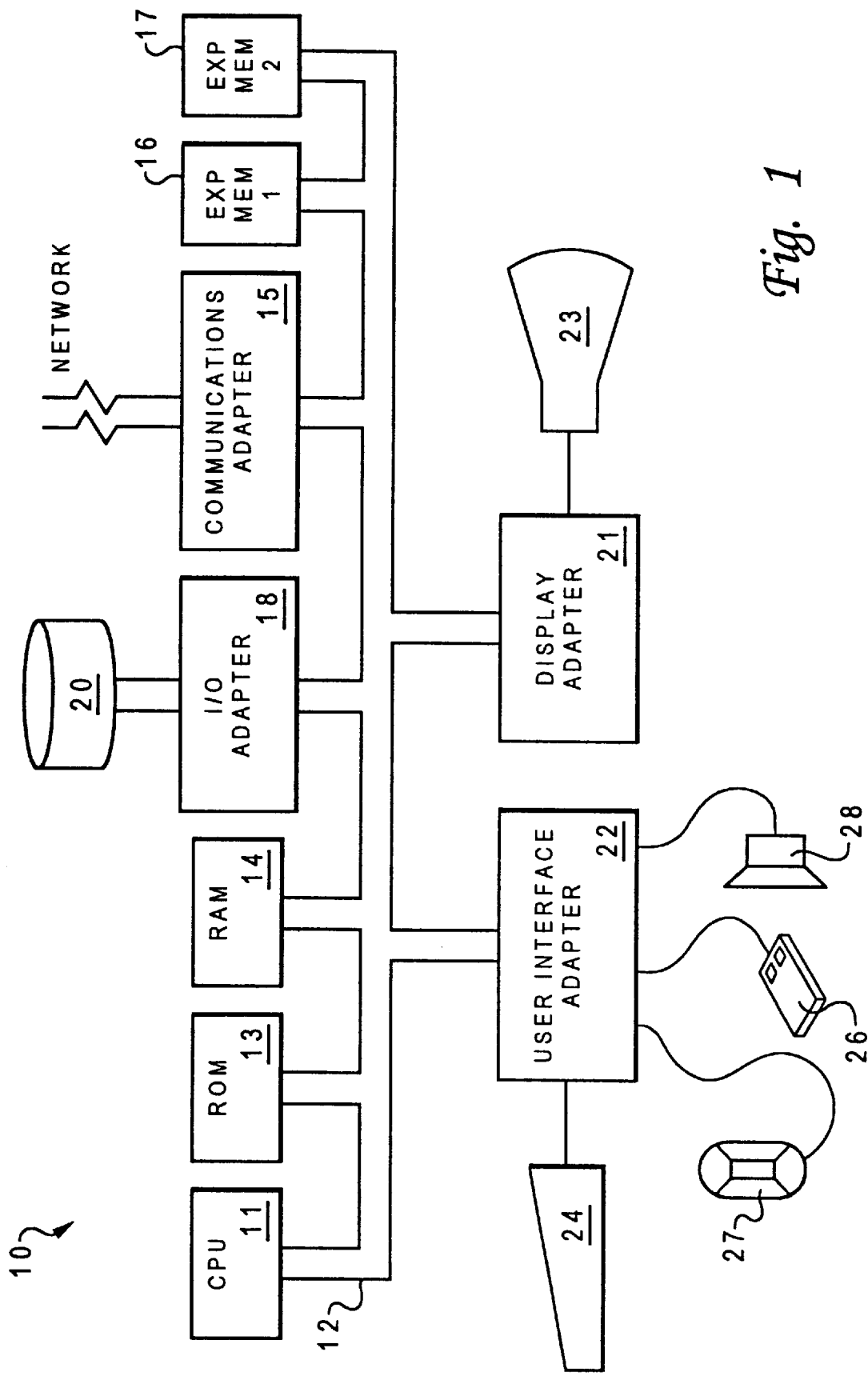
FIG. 1 is a diagram of a typical workstation which may be utilized in conjunction with a preferred embodiment of the present invention.

Referring now to the drawings and in particular to FIG. 1, there is depicted a diagram of a typical workstation 10 which may be utilized in conjunction with a preferred embodiment of the present invention. A central processing unit (CPU) 11 is interconnected to various other components via system bus 12. Read only memory (ROM) 13, connecting to CPU 11 via system bus 12, includes a basic input/output system (BIOS) software that controls certain basic functions of workstation 10. Random access memory (RAM) 14, I/O adapter 18, and communications adapter 15 are also interconnected to system bus 12. Expanded memory 16 and expanded memory 17 may be added to workstation 10, and are shown to be interconnected to system bus 12.

Generally, expanded memories 16 and 17 are adapter cards that include multiple single in-line memory modules (SIMMs) along with corresponding registers capable of being written to by an appropriate device driver. I/O adapter 18 may be a Small Computer System Interface (SCSI) adapter that communicates with a disk storage device 20. Communications adapter 15 interconnects system bus 12 with an outside network, enabling workstation 10 to communicate with other such systems. In addition, input/output devices are connected to system bus 12 via user interface adapter 22 and display adapter 21. Keyboard 24, track ball 27, mouse 26, and speaker 28 are all interconnected to system bus 12 via user interface adapter 22. Display monitor 23 is connected to system bus 12 via display adapter 21. In this manner, a user is capable of inputting to workstation 10 through keyboard 24, track ball 27, or mouse 26 while receiving output from workstation 10 via speaker 28 and display monitor 23. Additionally, an operating system such as AIX™ from International Business Machines Corporation may be utilized to coordinate the functions of the various components shown in FIG. 1.

Preferred implementations of the invention include implementations as a computer system programmed to execute the method or methods described herein, and as a computer program product. According to the computer system implementation, sets of instructions for executing the method or methods are resident in the random access memory 14 of one or more computer systems configured generally as described above. Until required by the computer system, the set of instructions may be stored as a computer program product in another computer memory, for example, in disk drive 20 (which may include a removable memory such as an optical disk or floppy disk for eventual use in the disk drive 20). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting or other terms that could be associated with a human operator. However, for at least a number of the operations described herein which form part of the present invention, no action by a human operator is desirable. The operations described are, for at least the most part, machine operations processing electrical signals to generate other electrical signals.

Figure 2:
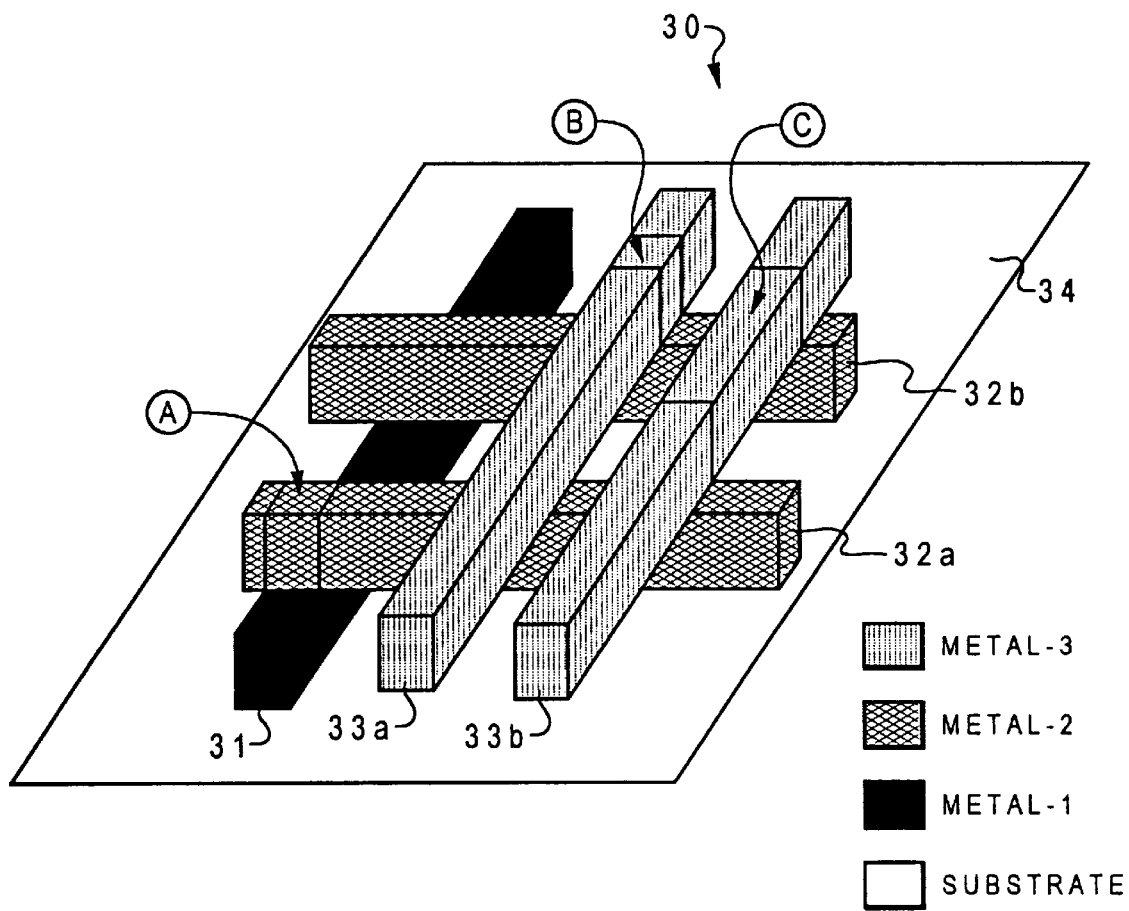
FIG. 2 is a pictorial illustration of a typical multi-layer metal interconnect geometry.

With reference now to FIG. 2, there is a pictorial illustration of a typical multi-layer metal interconnect geometry. Interconnect geometry 30, as shown, is comprised of a metal-1 layer, a metal-2 layer, a metal-3 layer, and a substrate layer, though more or fewer metal layers may be present. Various interconnects in each metal layer depicted in FIG. 2 are represented by a metal-1 wire 31; metal-2 wires 32a, 32b; and metal-3 wires 33a, 33b on top of a substrate 34. In addition, there is a dielectric layer (not shown) embedded between each of the above-mentioned layers.

Each of wires 31–33 in FIG. 2 may be conceptually broken down into several overlapping regions, depending on the interconnect layer present directly above and below the wire segment. If crossover capacitance was the only effect to be considered, then each overlapping region can be processed separately to obtain the total capacitance. In order to properly account for fringing and line-to-line effects, however, the knowledge of an interconnect wire's nearest neighbors on each metal layer is also required. Given the proximity of a ground plane on substrate 34, it is only necessary to look for a neighbor within a distance of several inter-layer dielectric (ILD) thicknesses away from the overlapping region perpendicular to the edges of the overlapping region. If no edge is found within this distance, then the neighborhood is considered empty. Some examples of overlapping regions for interconnect geometry 30 are shown in FIG. 2. Overlapping region A includes a metal-2 layer, a metal-1 layer, and a substrate layer. Overlapping region B includes a metal-3 layer, a metal-2 layer, and a substrate layer. Overlapping region C includes a metal-3 layer and a substrate layer.

The information about the metal layers present within an overlapping region and the edge parallel to the sides of the overlapping region constitutes a "capacitance event". Thus, a capacitance event is designated by the layers present in a unique rectangular overlapping region, in which every layer is either fully present or not present at all, and a unique neighborhood is perpendicular to each side of the overlapping region.

After an overlapping region has been defined, information about wire conductor edges, or "true edges," present on the sides of the overlapping region, can be specified accordingly. A "neighborhood" in a given direction, is described by the distance and the netname of the nearest wire conductor edge on each metal layer present within an overlapping region. If the nearest edge on a certain metal layer is more than a prescribed distance away, then the neighborhood is considered empty on that metal layer. For example, in FIG. 2, if metal-2 wire 32a is placed at a location more than a prescribed distance away from metal-2 wire 32b of overlapping region B, then the neighborhood in that direction for metal-2 layer is considered as empty.

For a majority of VLSI circuit layouts, the shapes of wire conductors within various metal layers are primarily rectilinear and run in two orthogonal directions. These two orthogonal directions may be arbitrarily defined as north/south and east/west or front/back and left/right. By relying upon the assumption that each wire conductor within various metal layers is rectilinear and run in one of the two orthogonal directions, the entire VLSI circuit layout can be uniquely and completely partitioned into multiple disjointed capacitance events.

Figure 3:
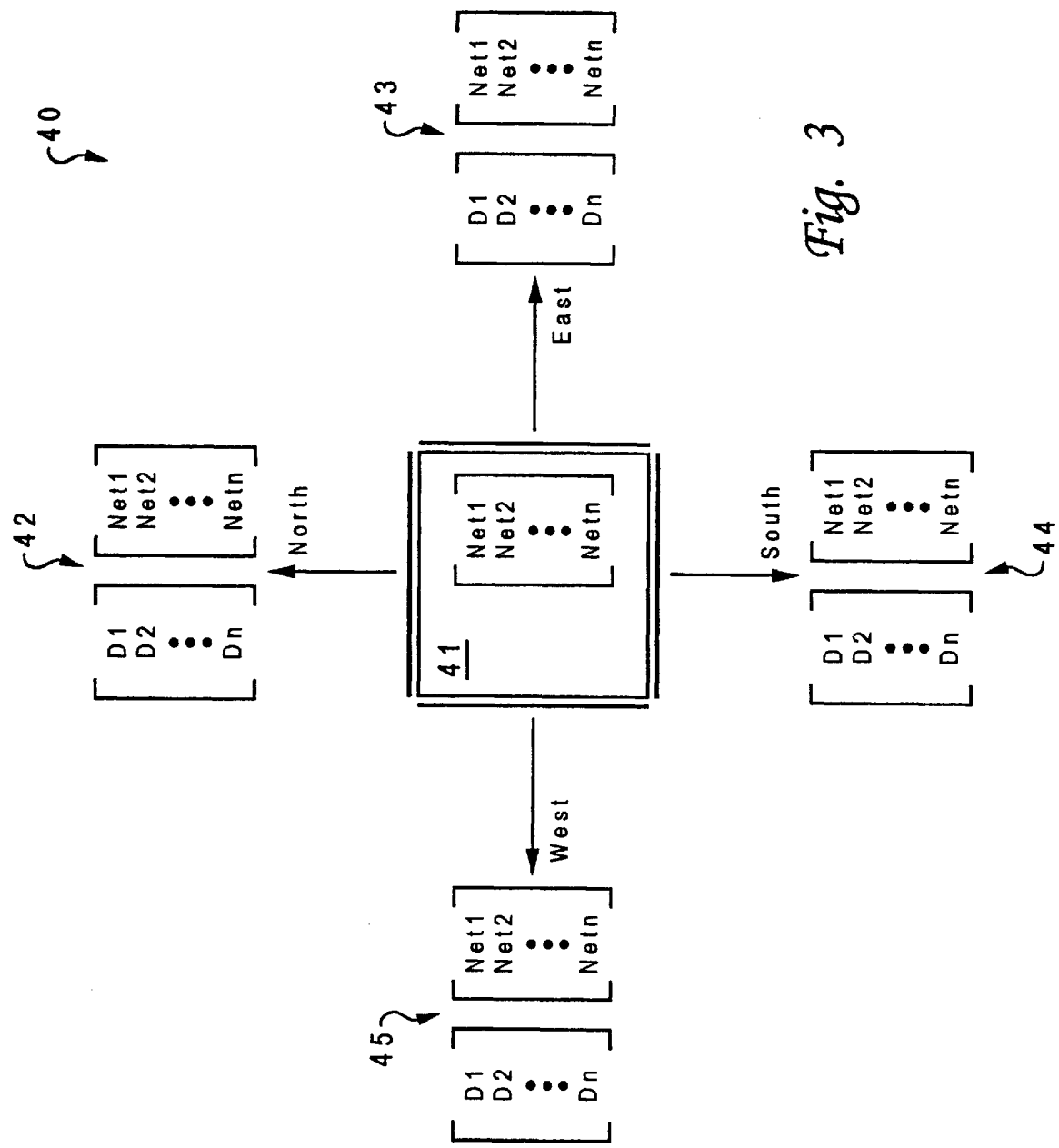
FIG. 3 is a block diagram of a data structure that may be utilized to characterize a capacitance event in a multi-layer metal interconnect geometry.

Referring now to FIG. 3, there is shown a data structure that may be utilized to characterize a capacitance event in a multi-layer metal interconnect geometry. As shown, data structure 40 comprises a center array 41 and four neighborhood arrays 42–45. Center array 41 describes various wire conductors present within a specific overlapping region (or overlapping area) in the form of netnames. Each of four neighborhood arrays 42–45 defines whether or not there are true wire conductor edges present in each of the sides of the specific overlapping region, in the form of distance from the specific overlapping region along with the associated netnames ([D1, D2, . . . , Dn] [Net1, Net2, . . . , Netn]). In sum, each capacitance event is denoted by the following items:

1. coordinates of an overlapping region;
2. all layers present in the overlapping region;
3. true interconnect edge present on each side of the overlapping region;
4. neighborhood in the direction perpendicular to each side of the overlapping region.

Figure 4:
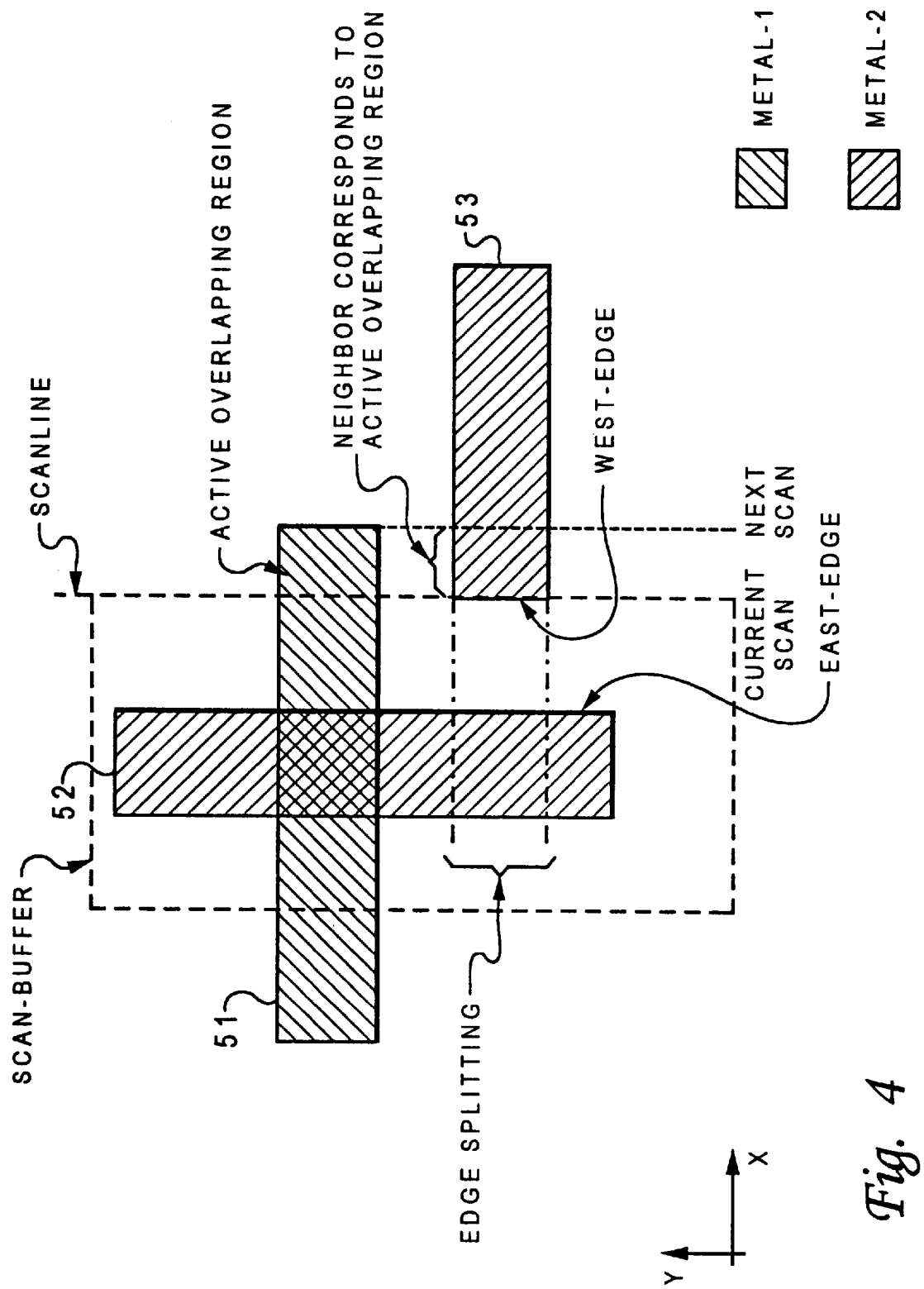
FIG. 4 is a pictorial diagram of a VLSI circuit layout example.

The present invention provides a shape-processing method and system to detect all the overlapping regions and their corresponding neighborhoods within a VLSI circuit layout. With reference now to FIG. 4, there is illustrated a pictorial diagram of a VLSI circuit layout example. As shown, rectangular shape 51 represents a wire conductor in metal-1 layer while rectangular shapes 52, 53 represent wire conductors in metal-2 layer. Typically, a scanline algorithm processes rectangular shapes 51–53 that are described by their edges. For the purpose of disclosing the present invention, it is assumed that all these edges lie in an x-y plane, and the scanline sweeps in the x-direction. Edges that are parallel to the x-axis are termed horizontal edges, while edges that are parallel to the y-axis are termed vertical edges. In addition, the vertical edge information may be implied by the horizontal edges and is not explicitly stored.

Before any data extraction, all wire conductor shapes within the VLSI circuit layout are converted to a list of edges, two horizontal edges for each rectangular shape. These edges preferably contain the following information:

$x_{min}$, $x_{max}$, and y up, down flag layer net number

The $x_{min}$, $x_{max}$, and y are coordinates. The up, down flag indicates which side of the edge is painted. The vertical edges in the layout can be deduced from the horizontal edges and the up, down information. The layer number indicates the metal layer that the rectangular shape is on. The net number indicates the circuit network that the wire conductor shapes belong to.

Subsequently, each edge is first read in an ascending order from the input. All edges are assumed to be sorted by $x_{min}$ in the input. A scanline stop is scheduled wherever a new edge is encountered, or an edge cut by the current scanline ends. At each scanline stop, all edges starting at that x position are read in, while all edges currently on the scanline that end at the current x position are written out.

All incoming edges are inserted into an appropriate position of a height-balance tree, known to those skilled in the relevant art as a scanline tree. The scanline tree maintains a record of all the edges currently intersecting the scanline position (horizontal edges) in this scanline tree. In order to schedule scanline stops, a priority queue is maintained. The priority queue is arranged in the order of $x_{max}$ of each edge in the scanline tree. The head of the priority queue shows an edge with the smallest $x_{max}$. This helps in determining which edges are ready to be removed from the scanline tree and, hence, for scheduling the scanline stop. The x location of a subsequent scanline stop is given by a minimum of the $x_{max}$ of the edge at the head of the priority queue and the $x_{min}$ of the next edge in the sorted input.

After all incoming edges have been inserted into their appropriate positions on the scanline tree, an in-order traversal is performed on the scanline tree. This implies that edges are encountered in an increasing order of their y value. As edges are read, a record of the state of the scanline is maintained. The state of the scanline is denoted by the number of active layers. A layer-counter denotes the number of edges on each active layer. An entry within the layer-counter is incremented every time an up-pointing edge on that layer is encountered, and decremented each time a down-pointing edge is encountered. If an entry of the layer-counter is greater than zero, the corresponding layer is active. The state of the layer-counter describes all the active layers, and are invariant between consecutive edges in the in-order traversal. Thus, the state of the layer-counters, the coordinates of the current scan event and the next scan event, and the coordinates of the current edge and the next one define an invariant overlapping region. This overlapping region is part of a capacitance event.

Figure 5:
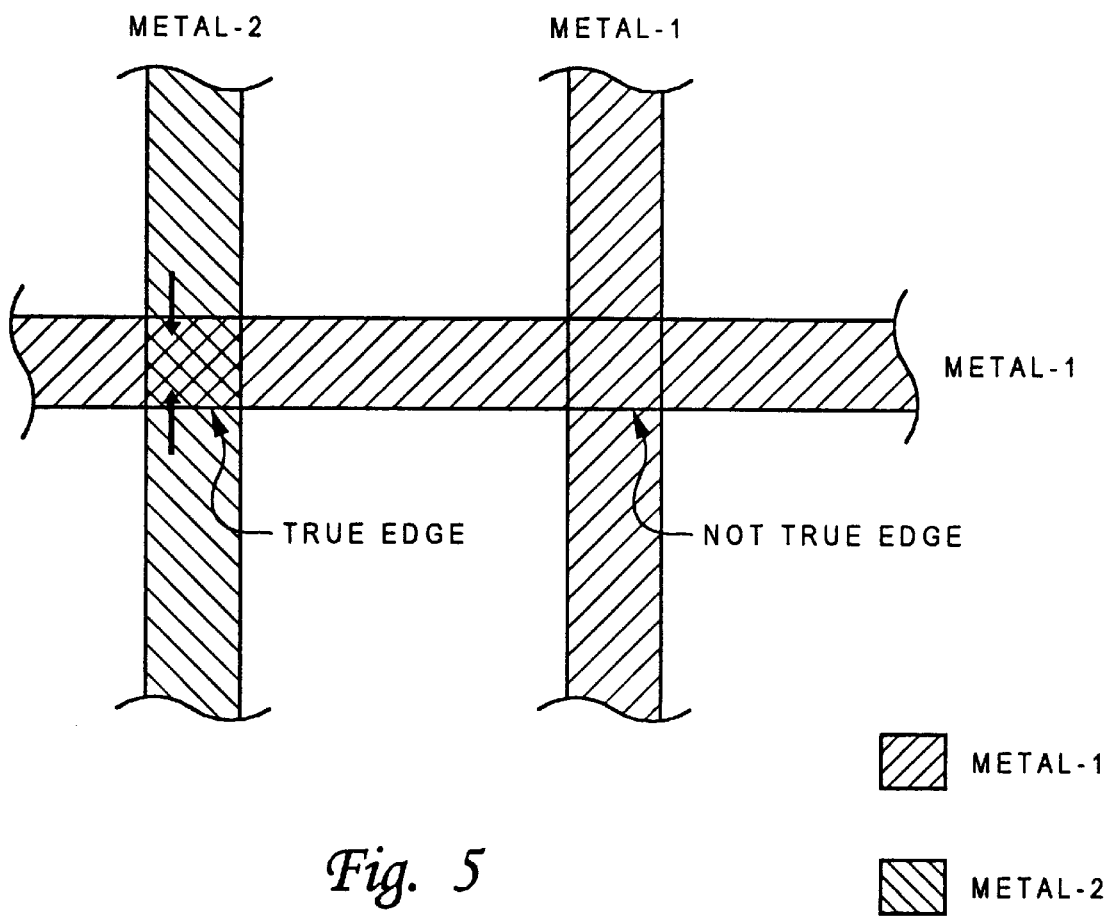
FIG. 5 is a pictorial illustration of a true edge and a non-true edge in a VLSI circuit layout.

As mentioned previously, only wire conductor edges (or sidewall) are considered as true edges, but sometimes an input edge may not represent a true edge in the circuit layout, especially when there are overlapping shapes on the same layer. This is depicted in FIG. 5. Hence, a layer-counter is utilized to detect true edges, in accordance with a preferred embodiment of the invention. Whenever a layer-counter changes its states, a horizontal edge is implied. In other words, when an entry within the layer-counter changes from a "zero" when encountering an up-pointing edge, that horizontal edge in that corresponding metal layer is a true edge. Or, when an entry within the layer-counter changes to a "zero" when encountering a down-pointing edge, that horizontal edge in that corresponding metal layer is also a true edge.

To detect vertical edges, another set of layer-counters that describe the state just left (i.e., at x slightly smaller than the current x location) of the scanline need to be maintained. So any edge with $x_{max}$ equal to the scanline location is included in this state, and any edge with $x_{min}$ equal to the scanline location is not included in this state information. In addition, information regarding south-pointing interconnect edges is stored in a forward-buffer while information regarding north-pointing interconnect edges is stored in a trailing-buffer during the traversal. The sizes of both forward-buffer and trailing-buffer define the size of a scan-buffer.

During the in-order traversal, implied vertical edges on the scanline are detected utilizing this state information. A vertical edge is detected whenever the left state layer-counter is zero and the current state layer-counter is greater than zero, or vice versa. The vertical edge is linked to the currently active overlapping region. Finally, a distance and a netname of a closest encountered horizontal interconnect edge on each layer that are not bound to the overlapping region are recorded.

In addition to the description of the overlapping layers on each overlapping region, a description of its neighborhood is performed next. A neighborhood in the direction parallel to the scanline is determined by considering adjacent edges on the scanline. At each stop of the scanline, edges that do not form a common overlapping region and occur consecutively on the scanline are neighbors. For a given overlapping region, the closest up-pointing neighbor on the north side and closest down-pointing neighbor on the south side, which are true edges, need to be found, on each layer, to completely describe the north and south neighborhood. If such a neighborhood does not exist on a certain layer within a pre-specified distance, then the neighborhood is empty on that layer. To implement this efficiently, in accordance with a preferred embodiment of the invention, a scan-buffer is maintained around a currently visited edge during the in-order traversal, extending both north and south of the currently visited edge. Then, the scan-buffer is queried in order to find the closest edge on each layer. If the currently visited edge forms an overlapping region below, then the up-pointing edges ahead of it, in the scan-buffer, are queried to determine the north neighbor of the overlapping region below. If the currently visited edge forms an overlapping region above, then the down-pointing edges before it, in the scan-buffer, are queried to determine the south neighbor of the overlapping region above.

However, the scanline does not maintain a record of the edges parallel to it. Also, some of the edges that the scanline has already swept past will couple to edges on the current scanline. Hence, additional information needs to be stored to determine the neighbors of overlapping regions in the direction orthogonal to the scanline. In order to determine the neighbors of each overlapping region in the direction orthogonal to the scanline efficiently, in accordance with a preferred embodiment of the invention, a second scan-buffer for storing the vertical edges detected during the scanline sweep is employed.

During the in-order traversal of the edges orthogonal to and intersecting the scanline, all edges parallel to the scanline and coincident with it are detected. As mentioned previously, these vertical edges are not present in the input, but are implied by the horizontal edges. Thus, after the in-order traversal of the scanline-tree, a list of vertical edges is available. Some vertical edges will have overlapping regions to their right (these edges are called west edges), and others will have overlapping regions to their left (these are called east edges). Accordingly, they are stored into two separate lists, namely, an east-edge list and a west-edge list. Only the edges in the west-edge list are compared against the edges already present in the second scan-buffer.

The requirement is that each east-edge in the second scan-buffer and each west-edge on the current scanline have a unique neighbor. To maintain this invariant, edges in the second scan-buffer are split depending on their visibility from the vertical edges on the scanline, and vice-versa. As the scanline advances to its next scheduled stop, the east-edges at the trailing end of the scan-buffer fall out. What this means is that their neighbors have been completely determined. This, in turn, implies that the capacitance event that these west edges are a part of have all the neighborhoods determined. Hence, they can be passed on to the capacitance calculation routine. The width of the scan-buffer is determined by the maximum distance over which edges are deemed to have significant coupling. Edges that are farther apart than the scan-buffer width have negligible coupling.

In order to effect the edge splitting, the vertical edges on the current scanline are kept in the west-edge list. Note that the edges in the west-edge list are non-overlapping. All edges in the second scan-buffer that overlap any edge in the west-edge list are found by scanning through all the edges in the second scan-buffer. These edges are sorted by increasing distance from the current scanline by virtue of the fact that all edges at a given x location enter the scan-buffer together. Each of these edges are compared against the edges in the west-edge list, starting with those nearest the scanline. Splitting is performed only if an edge in the west-edge list is not blocked by another edge in the second scan-buffer that is closer to the scanline position. This information is available by accessing the distance array for the edges in the west-edge list. Whenever a split is performed, the distance array and net array for the west-edge list are updated. All newly created west edges are inserted into the second scan-buffer. Each newly created edge is also linked to the overlapping region to which its parent edge was broken off from. The y coordinates of the broken edge are properly updated.

Not all edges intersecting the scanline need to be processed at a particular scanline stop. The scanline "activity" is limited to certain intervals. These intervals are determined from the new shapes entering the scanline at a particular scan position and from edges falling off the scanline. Any edge has capacitive influence only up to a certain distance. Hence, the intervals of activity are determined from the union of the areas of influence of the new edges and the terminating edges. This union will determine a set of non-overlapping intervals on the scanline. Each of these intervals can be processed separately. All the overlapping regions along the scanline that do not belong to one of these intervals need not be processed. This observation is very helpful in reducing the amount of processing required at each scanline stop. Also, it prevents the overlapping regions from being split artificially by the scanline stops.

In order to start the scanline processing at an interval boundary only, certain information needs to be stored at each node in the scanline-tree. This is the information about the active shapes on each layer, the last open edge on each layer prior to that node, and the capacitance event starting at that particular node. To start the processing, the layer-counters are initialized by the active layer information, and the first and the last open edges are recorded. Thus, the state of the scanline is properly initialized. The scan-buffer is initialized by scanning forward and backward from the first node in the interval. The state information, just to the left of the scanline is the same as that on the scanline, because there are no starting or ending edges at the beginning of an interval (by definition, the maximum coupling distance is greater than zero). During scanline processing, each interval of activity is processed separately (in fact, they can be processed in parallel). Also, the state information, after processing any node in the scanline tree, is stored on that node to facilitate further interval processing.

As has been described, the present invention provides a method and system for shape processing within a VLSI circuit layout for parasitic capacitance estimation. Though the present invention is intended for a preferred data structure, the principles as described may be applicable for capturing other types of data structures also.

While the invention has been particularly shown and described with reference to a preferred embodiment, it will be understood by those skilled in the art that various changes in form and detail may be made therein without departing from the spirit and scope of the invention.

What is claimed is:

1. A method of shape processing for extracting an interconnect capacitance event within an integrated circuit layout for parasitic capacitance estimation, said method comprising the steps of:

identifying a plurality of coordinates of an overlapping region formed by at least one interconnect;

classifying each metal layer present within said overlapping region;

determining each interconnect edge present on each side of said overlapping region; and determining a neighbor in a direction perpendicular to an east side and a west side of said overlapping region by traversing in-order along a scanline to locate each vertical interconnect edge while said scanline is intersecting said overlapping region at a scanstop;

comparing each west-pointing interconnect edges on said scanline to a plurality of east-pointing interconnect edges stored in a second scan-buffer for locating a corresponding east-pointing interconnect edge; and recording a distance and a netname of said corresponding east-interconnect edge.

2. The method of shape processing for extracting an interconnect capacitance event according to claim 1, wherein said step of determining each interconnect edge further includes the steps of:

obtaining edge information from said at least one interconnect by utilizing a vertical scanline, wherein said edge information includes an up/down flag and a layer number;

storing said edge information associated with each of said at least one interconnect as said vertical scanline encounters each edge of each of said at least one interconnect;

maintaining a layer-counter, wherein said layer-counter has a plurality of entries, wherein each entry corresponds to a metal layer in said integrated circuit layout, wherein a non-zero in an entry denotes the corresponding metal-layer is active;

incrementing a corresponding entry of said layer-counter when there is a change in a metal layer along said encountered edge and a corresponding up/down flag is pointing up;

decrementing a corresponding entry of said layer-counter when there is a change in a metal layer along said encountered edge and a corresponding up/down flag is pointing down; and acknowledging said encountered edge is an interconnect edge in a particular metal layer when there is a transition from or to a zero in an entry corresponding to said particular metal layer in said layer-counter.

3. The method of shape processing for extracting an interconnect capacitance event according to claim 1, wherein said step of determining a neighbor step further comprises determining a neighbor in a direction perpendicular to north side and south side of said overlapping region by traversing in-order along a scanline to locate each horizontal interconnect edge while said scanline is intersecting said overlapping region at a scanstop;

storing south-pointing interconnect edges in a forward-buffer and storing north-pointing interconnect edges in a trailing-buffer during said traversing, wherein the sizes of both forward-buffer and trailing-buffer define the size of a scan-buffer; and recording a distance and a netname of each encountered horizontal interconnect edge that is not bound to said overlapping region.

4. A computer system for shape processing to extract an interconnect capacitance event within an integrated circuit layout for parasitic capacitance estimation, said computer system comprising:

means for identifying a plurality of coordinates of an overlapping region formed by at least one interconnect;

means for classifying each metal layer present within said overlapping region;

means for determining each interconnect edge present on each side of said overlapping region; and means for determining a neighbor in a direction perpendicular to an east side and a west side of said overlapping region having means for traversing in-order along a scanline to locate each vertical interconnect edge while said scanline is intersecting said overlapping region at a scanstop;

means for comparing each west-pointing interconnect edges on said scanline to a plurality of east-pointing interconnect edges stored in a second scan-buffer for locating a corresponding east-pointing interconnect edge; and means for recording a distance and a netname of said corresponding east-interconnect edge.

5. The computer system for shape processing to extract an interconnect capacitance event according to claim 4, wherein said means for determining a neighbor further comprises means for determining a neighbor in a direction perpendicular to north side and south side of said overlapping region having means for traversing in-order along a scanline to locate each horizontal interconnect edge while said scanline is intersecting said overlapping region at a scanstop;

means for storing south-pointing interconnect edges in a forward-buffer and storing north-pointing interconnect edges in a trailing-buffer during said traversing, wherein the sizes of both forward-buffer and trailing-buffer define the size of a scan-buffer; and means for recording a distance and a netname of each encountered horizontal interconnect edge that is not bound to said overlapping region.

6. The computer system for shape processing to extract an interconnect capacitance event according to claim 4, wherein said means for determining each interconnect edge further includes:

means for obtaining edge information from said at least one interconnect by utilizing a vertical scanline, wherein said edge information includes an up/down flag and a layer number;

means for storing said edge information associated with each of said at least one interconnect as said vertical scanline encounters each edge of each of said at least one interconnect;

means for maintaining a layer-counter, wherein said layer-counter has a plurality of entries, wherein each entry corresponds to a metal layer in said integrated circuit layout, wherein a non-zero in an entry denotes the corresponding metal-layer is active;

means for incrementing a corresponding entry of said layer-counter when there is a change in a metal layer along said encountered edge and a corresponding up/down flag is pointing up;

means for decrementing a corresponding entry of said layer-counter when there is a change in a metal layer along said encountered edge and a corresponding up/down flag is pointing down; and means for acknowledging said encountered edge is an interconnect edge in a particular metal layer when there is a transition from or to a zero in an entry corresponding to said particular metal layer in said layer-counter.

7. A computer program product for shape processing to extract an interconnect capacitance event within an integrated circuit layout for parasitic capacitance estimation, said computer program product comprising:

program code means for identifying a plurality of coordinates of an overlapping region formed by at least one interconnect;

program code means for classifying each metal layer present within said overlapping region;

program code means for determining each interconnect edge present on each side of said overlapping region; and program code means for determining a neighbor in a direction perpendicular to an east side and a west side of said overlapping region having:

program code means for traversing in-order along a scanline to locate each vertical interconnect edge while said scanline is intersecting said overlapping region at a scanstop;

program code means for comparing each west-pointing interconnect edges on said scanline to a plurality of east-pointing interconnect edges stored in a second scan-buffer for locating a corresponding east-pointing interconnect edge; and program code means for recording a distance and a netname of said corresponding east-interconnect edge.

8. The computer program product for shape processing to extract an interconnect capacitance event according to claim 7, wherein said program code means for determining each interconnect edge further includes:

program code means for obtaining edge information from said at least one interconnect by utilizing a vertical scanline, wherein said edge information includes an up/down flag and a layer number;

program code means for storing said edge information associated with each of said at least one interconnect as said vertical scanline encounters each edge of each of said at least one interconnect;

program code means for maintaining a layer-counter, wherein said layer-counter has a plurality of entries, wherein each entry corresponds to a metal layer in said integrated circuit layout, wherein a non-zero in an entry denotes the corresponding metal-layer is active;

program code means for incrementing a corresponding entry of said layer-counter when there is a change in a metal layer along said encountered edge and a corresponding up/down flag is pointing up;

program code means for decrementing a corresponding entry of said layer-counter when there is a change in a metal layer along said encountered edge and a corresponding up/down flag is pointing down; and program code means for acknowledging said encountered edge is an interconnect edge in a particular metal layer when there is a transition from or to a zero in an entry corresponding to said particular metal layer in said layer-counter.

9. The computer program product for shape processing to extract an interconnect capacitance event according to claim 7, wherein said program code means for determining a neighbor further comprises program code means for determining a neighbor in a direction perpendicular to north side and south side of said overlapping region having:

program code means for traversing in-order along a scanline to locate each horizontal interconnect edge while said scanline is intersecting said overlapping region at a scanstop;

program code means for storing south-pointing interconnect edges in a forward-buffer and storing north-pointing interconnect edges in a trailing-buffer during said traversing, wherein the sizes of both forward-buffer and trailing-buffer define the size of a scan-buffer; and program code means for recording a distance and a netname of each encountered horizontal interconnect edge that is not bound to said overlapping region.

* * * * *